(12) United States Patent
Kasahara et al.

(10) Patent No.: US 11,398,432 B2
(45) Date of Patent: Jul. 26, 2022

(54) WIRING SUBSTRATE AND ELECTRONIC DEVICE

(71) Applicant: SHINKO ELECTRIC INDUSTRIES CO., LTD., Nagano (JP)

(72) Inventors: Tetsuichiro Kasahara, Nagano (JP); Tsukasa Nakanishi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/868,666

(22) Filed: May 7, 2020

(65) Prior Publication Data

US 2020/0365516 A1 Nov. 19, 2020

(30) Foreign Application Priority Data

May 14, 2019 (JP) .............................. JP2019-091623

(51) Int. Cl.
*H01L 23/538* (2006.01)
*H01L 25/16* (2006.01)
*H01L 21/48* (2006.01)

(52) U.S. Cl.
CPC ...... *H01L 23/5389* (2013.01); *H01L 23/5383* (2013.01); *H01L 25/16* (2013.01); *H01L 21/4857* (2013.01)

(58) Field of Classification Search
CPC . H01L 23/5389; H01L 23/5383; H01L 25/16; H01L 21/4857
See application file for complete search history.

(56) References Cited

U.S. PATENT DOCUMENTS

| | | | | |
|---|---|---|---|---|
| 2012/0133052 | A1* | 5/2012 | Kikuchi | .................. H01L 24/24 257/774 |
| 2016/0014898 | A1* | 1/2016 | Adachi | ..................... H05K 1/09 361/767 |
| 2016/0105960 | A1* | 4/2016 | Sakamoto | ............ H05K 3/4694 361/720 |
| 2016/0164159 | A1* | 6/2016 | Inagaki | ............... H01L 23/5383 333/238 |
| 2017/0207148 | A1 | 7/2017 | Kasahara et al. | |
| 2017/0323838 | A1* | 11/2017 | Otsubo | ............... H01L 23/3135 |
| 2020/0185300 | A1* | 6/2020 | Xu | ......................... H01L 23/053 |

FOREIGN PATENT DOCUMENTS

JP 2017-130493 7/2017

* cited by examiner

*Primary Examiner* — Fernando L Toledo
*Assistant Examiner* — Neil R Prasad
(74) *Attorney, Agent, or Firm* — Rankin, Hill & Clark LLP

(57) ABSTRACT

A wiring substrate includes a resin layer formed of an insulating resin, a first component, at least a part of which is embedded in the resin layer, a first wiring embedded in the resin layer, the first wiring including an exposed surface exposed from the resin layer at a first surface-side of the resin layer, and a first electrode including a wiring portion and an electrode portion, the wiring portion embedded in the resin layer and connecting to the first component in the resin layer, the electrode portion protruding from the first surface-side of the resin layer to a position higher than the exposed surface of the first wiring.

8 Claims, 19 Drawing Sheets

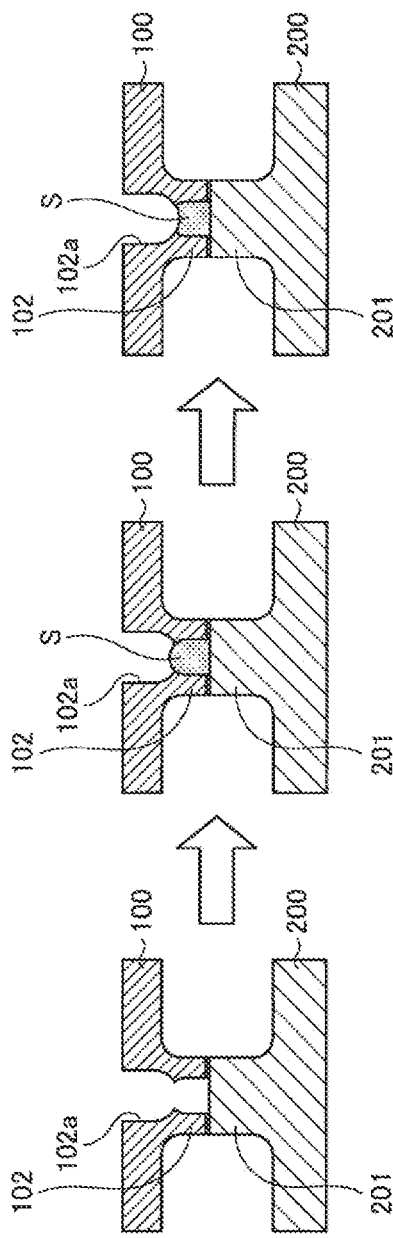

WIRING SUBSTRATE AND ELECTRONIC DEVICE

CROSS-REFERENCE TO RELATED APPLICATIONS

This application is based upon and claims the benefit of priority from prior Japanese patent application No. 2019-091623, filed on May 14, 2019, the entire contents of which are incorporated herein by reference.

TECHNICAL FIELD

The present disclosure relates to a wiring substrate and an electronic device.

BACKGROUND ART

In the related art, known is a wiring substrate including electrodes embedded in a resin layer formed of an insulating resin and protruding from one surface-side of the resin layer, and wirings arranged on the resin layer.

CITATION LIST

Patent Document
 [PTL 1]
 JP-A-2017-130493

In the wiring substrate, a component such as a semiconductor chip may be embedded in the resin layer, from a viewpoint of implementing high-density component mounting. The component embedded in the resin layer is connected to a base end portion of an electrode embedded in the resin layer. An external component such as an inductor is mounted on the wiring substrate having the component embedded in the resin layer, so that an electronic device is manufactured. When mounting the external component to the wiring substrate, the external component is joined to the electrode protruding from one surface-side of the resin layer.

When the external component is joined to the electrode protruding from one surface-side of the resin layer, in this way, the external component and the wiring arranged on the resin layer come close to each other. When the external component and the wiring arranged on the resin layer come close to each other, a possibility that the external component will come into contact with the wiring on the resin layer increases. As a result, there is a concern that a short will occur between the external component and the wiring. The short between the external component and the wiring is not favorable because it is a factor that hinders improvement in a wiring density of the wiring substrate.

SUMMARY OF DISCLOSURE

Aspect of non-limiting embodiments of the present disclosure is to provide a wiring substrate and an electronic device which can suppress a short between an external component joined to an electrode and a wiring.

A wiring substrate according to the preset disclosure comprises:
 a resin layer formed of an insulating resin;
 a first component, at least a part of which is embedded in the resin layer;
 a first wiring embedded in the resin layer, the first wiring including an exposed surface exposed from the resin layer at a first surface-side of the resin layer; and
 a first electrode including a wiring portion and an electrode portion, the wiring portion embedded in the resin layer and connecting to the first component in the resin layer, the electrode portion protruding from the first surface-side of the resin layer to a position higher than the exposed surface of the first wiring.

According to one aspect of the wiring substrate of the present disclosure, it is possible to suppress a short between the external component joined to the electrode and the wiring.

BRIEF DESCRIPTION OF DRAWINGS

FIGS. 15A to 15C depict an example of a reflow joining method.

DETAILED DESCRIPTION OF EMBODIMENTS

Hereinbelow, embodiments of a wiring substrate, an electronic device, and a manufacturing method of a wiring substrate of the present disclosure will be described in detail with reference to the drawings. The disclosed technology is not limited by the embodiments.

Embodiment

[Configuration of Wiring Substrate]

Figure 1:
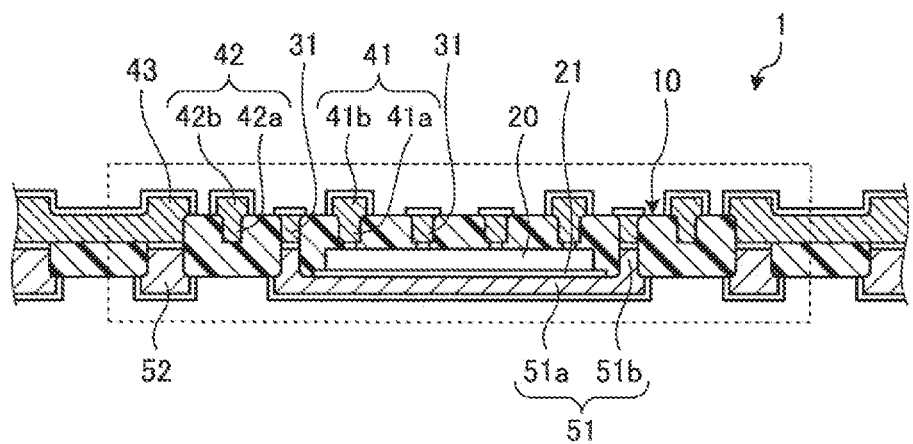
FIG. 1 depicts an example of a configuration of a wiring substrate in accordance with an embodiment.

FIG. 1 depicts an example of a configuration of a wiring substrate 1 in accordance with an embodiment. In FIG. 1, a cross-section of the wiring substrate 1 is pictorially shown. In the wiring substrate 1 shown in FIG. 1, a unit surrounded by the broken line is repeatedly aligned in a right and left direction in FIG. 1. The unit surrounded by the broken line is a unit that is to be separated as an electronic device after external components such as an inductor are mounted on the wiring substrate 1. In the below, an embodiment is described using the unit surrounded by the broken line as an example of the wiring substrate 1. The number of the units surrounded by the broken line is not particularly limited.

The wiring substrate 1 has a resin layer 10. In the resin layer 10, a first component 20 is embedded. In the resin layer 10, wirings 31, first electrodes 41, second electrodes 42, third electrodes 43, and fourth electrodes 52 are additionally embedded. Also, the resin layer 10 is provided with a pad 51 for mounting the first component 20. An area, which is exposed from the resin layer 10, of each surface of the wirings 31, the first electrodes 41, the second electrodes 42, the third electrodes 43, the pad 51 and the fourth electrodes 52 is formed with a plating. In descriptions below, an upper surface in FIG. 1 is referred to as 'upper surface' and a lower surface in FIG. 1 is referred to as 'lower surface'. However, the wiring substrate 1 may be used with being upside down vertically or may be used with any posture, for example.

The resin layer 10 is formed of an insulating resin. The insulating resin for forming the resin layer 10 covers the first component 20 in the resin layer 10.

The first component 20 is an electronic component such as a semiconductor chip, and is embedded in the resin layer 10. The first component 20 is mounted on the pad 51. That is, a lower surface of the first component 20 is joined to the pad 51 by a joining material 21. As the joining material 21, for example, soldering, thermal conductive paste, TIM (Thermal Interface Material) and the like are used. The wirings 31 and the first electrodes 41 are connected to an upper surface of the first component 20.

The wirings 31 are embedded in the resin layer 10. The wirings 31 are formed in a pattern shape, in correspondence to a plurality of preset positions in the resin layer 10. Some wirings 31 of the plurality of wirings 31 formed in a pattern shape are connected to a preset joining target. For example, the wirings 31 are arranged above the first component 20 in the resin layer 10, and the wirings 31 arranged above the first component 20 are connected to the first component 20. The wiring 31 and the first component 20 are connected using soldering, for example. Also, for example, the wirings 31 are arranged above an outer edge portion 51b of the pad 51 (which will be described later) in the resin layer 10, and the wirings 31 arranged above the outer edge portions 51b of the pad 51 are connected to the outer edge portion 51b of the pad 51. The wiring 31 and the outer edge portion 51b of the pad 51 are connected using soldering, for example. An upper surface of the wiring 31 is exposed on the upper surface-side of the resin layer 10. In the present embodiment, the upper surface of the wiring 31 is exposed on a plane that is flush with the upper surface of the resin layer 10.

The first electrode 41 is an electrode that can be joined to a second component (external component) such as an inductor, is embedded in the resin layer 10 together with the wiring 31 and is connected to the first component 20 in the resin layer 10. The first electrode 41 and the first component 20 are interconnected by soldering, for example. The first electrode 41 protrudes from the upper surface-side of the resin layer 10 to a position higher than the upper surface of the wiring 31.

The first electrode 41 embedded in the resin layer 10 together with the wiring 31 protrudes from the upper surface-side of the resin layer 10 to the position higher than the upper surface of the wiring 31, so that even when the second component is joined to the first electrode 41, the second component and the wiring 31 are spaced by a predetermined interval. Thereby, it is possible to reduce a possibility that the second component joined to the first electrode 41 will come into contact with the wiring 31. As a result, it is possible to suppress a short between the second component joined to the first electrode 41 and the wiring 31.

Herein, a detailed structure of the first electrode 41 is described. The first electrode 41 has a wiring portion 41a and an electrode portion 41b. The wiring portion 41a is embedded in the resin layer 10 together with the wiring 31 and is connected to the first component 20 in the resin layer 10. The wiring portion 41a indicates a conductive body that is embedded in the resin layer 10, has one surface exposed from the resin layer 10 and is connected to the electrode portion 41b. In contrast, the wiring 31 indicates a conductive body that is embedded in the resin layer 10 and has one surface thereof exposed from the resin layer 10 and is not connected to the electrode portion 41b. The electrode portion 41b is a portion that protrudes from the wiring portion 41a to a position higher than the upper surface of the resin layer 10 and can be joined to the second component. The electrode portion 41b has such a shape that becomes wider toward the wiring portion 41a. The electrode portion 41b has such a shape that becomes wider toward the wiring portion 41a, so that a side surface of the electrode portion 41b becomes a curved surface and when the electrode portion 41b is joined to the second component by soldering, the soldering is captured by the side surface of the electrode portion 41b. Thereby, outflow of the soldering from the first electrode 41 to the wiring 31 adjacent to the first electrode 41 is limited. As a result, a short between the first electrode 41 and the wiring 31 can be suppressed.

The second electrode 42 is an electrode that can be joined to a third component (external component) such as a capacitor, is embedded in the resin layer 10 together with the wiring 31 and is connected to the wiring 31. That is, the second electrode 42 is connected to the wiring 31 arranged above the outer edge portion 51b of the pad 51 at an inner position not shown in FIG. 1 (refer to FIG. 10). The second electrode 42 protrudes from the upper surface-side of the resin layer 10 to a position higher than the upper surface of the wiring 31.

The second electrode 42 embedded in the resin layer 10 together with the wiring 31 protrudes from the upper surface-side of the resin layer 10 to the position higher than the upper surface of the wiring 31, so that even when the third component is joined to the second electrode 42, the third component and the wiring 31 are spaced by a predetermined interval. Thereby, it is possible to reduce a possibility that the third component joined to the second electrode 42 will come into contact with the wiring 31. As a result, it is possible to suppress a short between the third component joined to the second electrode 42 and the wiring 31.

The second electrode 42 has a structure that is substantially similar to the first electrode 41. That is, the second electrode 42 has a wiring portion 42a that is embedded in the resin layer 10 together with the wiring 31, and an electrode portion 42b that protrudes from the wiring portion 42a to a position higher than the upper surface of the resin layer 10 and can be joined to the third component. The electrode portion 42b has such a shape that becomes wider toward the wiring portion 42a. The electrode portion 42b has such a shape that becomes wider toward the wiring portion 41a, so that a side surface of the electrode portion 42b becomes a curved surface and when the electrode portion 42b is joined to the third component by soldering, the soldering is captured by the side surface of the electrode portion 42b. Thereby, outflow of the soldering from the second electrode 42 to the wiring 31 adjacent to the second electrode 42 is limited. As a result, a short between the second electrode 42 and the wiring 31 can be suppressed.

The third electrode 43 is an electrode that can be joined to the third component, and is embedded in the resin layer 10 together with the wiring 31. The third electrode 43 protrudes from the upper surface-side of the resin layer 10 to a position higher than the upper surface of the wiring 31.

The third electrode 43 embedded in the resin layer 10 together with the wiring 31 protrudes from the upper surface-side of the resin layer 10 to the position higher than the upper surface of the wiring 31, so that even when the third component is joined to the third electrode 43, the third component and the wiring 31 are spaced by a predetermined interval. Thereby, it is possible to reduce a possibility that the third component joined to the third electrode 43 will come into contact with the wiring 31. As a result, it is possible to suppress a short between the third component joined to the third electrode 43 and the wiring 31.

The pad 51 is arranged on a lower surface of the resin layer 10. The pad 51 is mounted thereon with the first component 20 in the resin layer 10. The pad 51 is formed of, for example, metal such as copper, and has a base portion 51a and an outer edge portion 51b. In the base portion 51a, an area in which the first component 20 can be mounted is formed. The outer edge portion 51b is erected from the base portion 51a so as to surround the area in which the first component 20 can be mounted, is embedded in the resin layer 10 and is connected to the wirings 31. The outer edge portion 51b has, for example, a protrusion shape or a frame shape. The outer edge portion 51b and the wiring 31 is interconnected by soldering, for example. The pad 51 has only to have at least the base portion 51a, and the outer edge portion 51b may be omitted as appropriate.

The fourth electrode 52 is embedded in the resin layer 10, is connected to the third electrode 43, and protrudes from the lower surface-side of the resin layer 10. The fourth electrode 52 is used as an external connection terminal when the wiring substrate 1 is connected to another wiring substrate.

[Configuration of Electronic Device]

Figure 2:
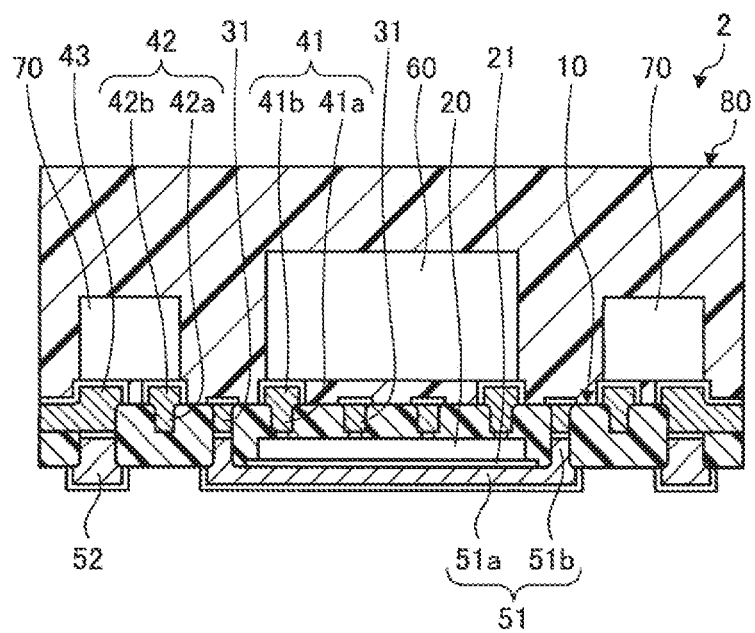
FIG. 2 depicts an example of a configuration of an electronic device manufactured using the wiring substrate of the embodiment.

FIG. 2 depicts an example of a configuration of an electronic device 2 manufactured using the wiring substrate 1 of the embodiment. In FIG. 2, a cross-section of the electronic device 2 is pictorially shown. As shown in FIG. 2, the electronic device 2 includes a resin layer 10, a second component 60, third components 70, and a sealing resin 80. The resin layer 10 corresponds to the resin layer 10 shown in FIG. 1. In the resin layer 10, the first component 20 is embedded. In the resin layer 10, the wirings 31, the first electrodes 41, the second electrodes 42, the third electrodes 43, and the fourth electrodes 52 are additionally embedded. Also, the resin layer 10 is provided with the pad 51 for mounting the first component 20.

The second component 60 is an external component such as an inductor, and is joined to the first electrodes 41. The third component 70 is an external component such as a capacitor, and is joined to the second electrode 42 and the third electrode 43. The sealing resin 80 is formed on the resin layer 10 so as to cover the second component 60 and the third components 70.

[Manufacturing Method of Wiring Substrate]

Figure 3:
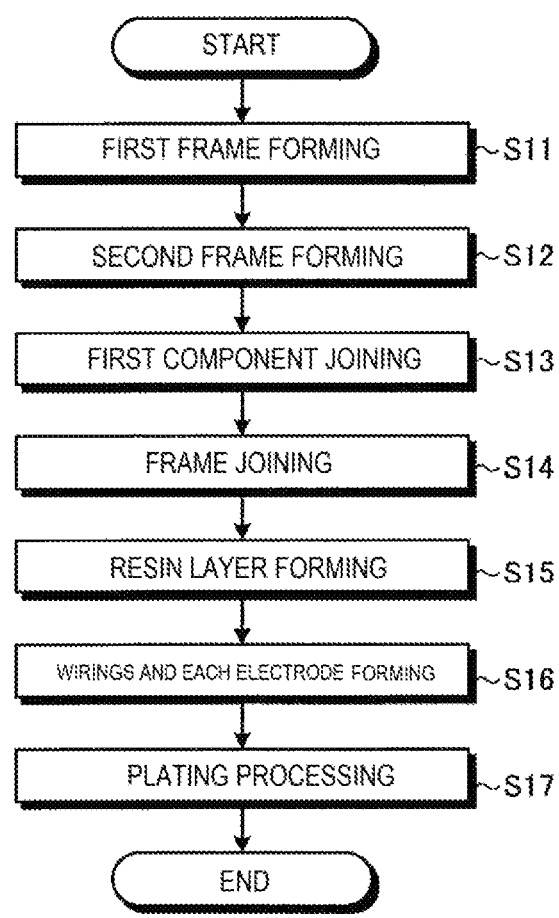
FIG. 3 is a flowchart depicting an example of a manufacturing method of the wiring substrate in accordance with the embodiment.

Subsequently, a manufacturing method of the wiring substrate 1 in accordance with the embodiment is specifically described with reference to a flowchart of FIG. 3. FIG. 3 is a flowchart depicting an example of a manufacturing method of the wiring substrate 1 in accordance with the embodiment.

Figure 4:
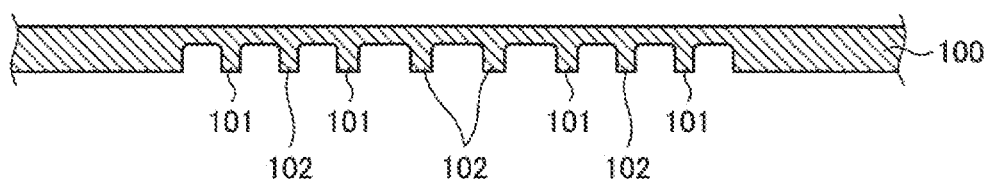
FIG. 4 depicts a specific example of a first frame forming process.

First, a first frame 100 having a plurality of first protrusions and a plurality of second protrusions formed therein is formed (step S11). Specifically, for example, as shown in FIG. 4, a metal plate formed of metal such as copper is prepared, and a predetermined area of the metal plate is etched, so that a first frame 100 having a plurality of first protrusions 101 and a plurality of second protrusions 102 formed therein is formed. FIG. 4 depicts a specific example of a first frame forming process. The plurality of first protrusions 101 is formed in areas of the metal plate in which the first electrodes 41 and the second electrodes 42 are to be formed, and the plurality of second protrusions 102 is formed in areas of the metal plate in which the wirings 31 are to be formed.

Figure 5:
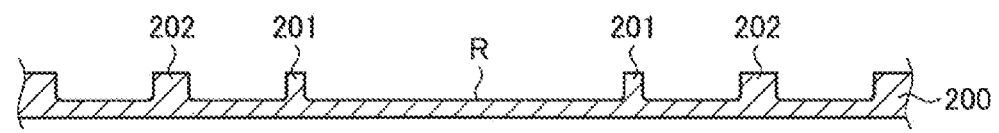
FIG. 5 depicts a specific example of a second frame forming process.

Then, a second frame 200 having a mounting area in which the first component 20 can be mounted, an edge surrounding the mounting area and third protrusions is formed (step S12). Specifically, for example, as shown in FIG. 5, a metal plate formed of metal such as copper is prepared, and a predetermined area of the metal plate is etched, so that a second frame 200 having a mounting area R in which the first component 20 can be mounted, an edge 201 surrounding the mounting R area and third protrusions 202 is formed. FIG. 5 depicts a specific example of a second frame forming process. The edge 201 is formed in an area of the metal plate in which the outer edge portion 51b of the pad 51 is to be formed. When the outer edge portion 51b of the pad 51 is omitted, the edge 201 is not formed. The third protrusions 202 is formed in areas of the metal plate in which the fourth electrodes 52 are to be formed.

The sequence of the first frame forming process (step S11) and the second frame forming process (step S12) may be exchanged. That is, after the second frame 200 is formed, the first frame 100 may be formed.

Figure 6:
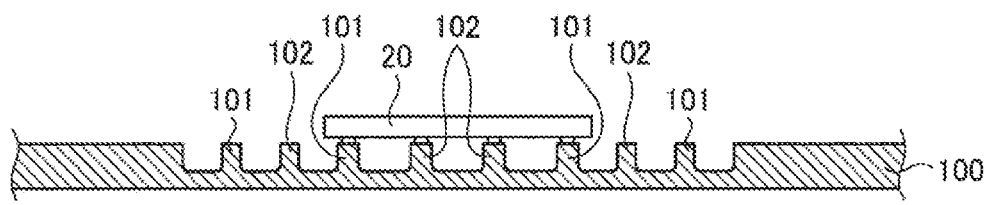
FIG. 6 depicts a specific example of a first component joining process.

After the first frame 100 and the second frame 200 are formed, the first component 20 is joined to some of the plurality of first protrusions 101 of the first frame 100 and some of the plurality of second protrusions 102 of the first frame 100 (step S13). Specifically, for example, as shown in FIG. 6, the first component 20 is joined to two first protrusions 101 positioned in areas in which the first electrodes 41 are to be formed and two second protrusions 102 positioned in areas in which the wirings 31 above the first component 20 are to be formed. FIG. 6 depicts a specific example of a first component joining process. The first component 20 is joined to the two first protrusions 101 and the two second protrusions 102 by soldering, for example.

Figure 7:
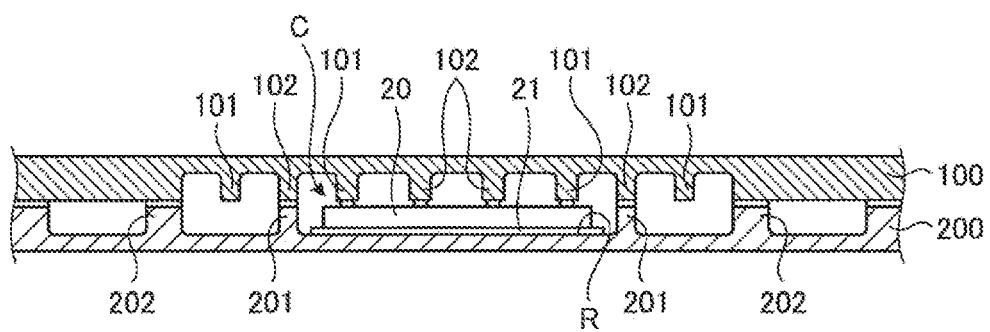
FIG. 7 depicts a specific example of a frame joining process.

Then, the joined first component 20 is mounted in the mounting area R of the second frame 200, and the first frame 100 and the second frame 200 are joined to each other (step S14). Specifically, for example, as shown in FIG. 7, the first component 20 is joined onto the mounting area R of the second frame 200 by the joining material 21, and two second protrusions 102 that are not joined to the first component 20 are joined to the edge 201 of the second frame 200. Also, a flat part of the first frame 100 in which the plurality of first protrusions 101 and the plurality of second protrusions 102 are not formed is joined to the third protrusions 202 of the second frame 200. FIG. 7 depicts a specific example of a frame joining process. The two second protrusions 102 of the first frame 100 and the edge 201 of the second frame 200 are joined to each other by soldering, for example. The flat part of the first frame 100 and the third protrusions 202 of the second frame 200 are joined to each other by soldering, for example. A melting point of the soldering joining the second protrusions 102 and the edge 201 each other and a melting point of the soldering joining the flat part of the first frame 100 and the third protrusions 202 each other are lower than a melting point of the soldering joining the first component 20 and the first protrusions 101 and second protrusions 102 each other. Thereby, when the first frame 100 and the second frame 200 are joined to each other, melting of the soldering between the first component 20 and the first protrusions 101 and second protrusions 102 can be avoided, so that it is possible to improve connection reliability of the first component 20 by the soldering. When the two second protrusions 102 of the first frame 100 and the edge 201 of the second frame 200 are joined to each other and the flat part of the first frame 100 and the third protrusions 202 of the second frame 200 are joined to each other, a space C is formed between the first frame 100 and the second frame 200.

Figure 8:
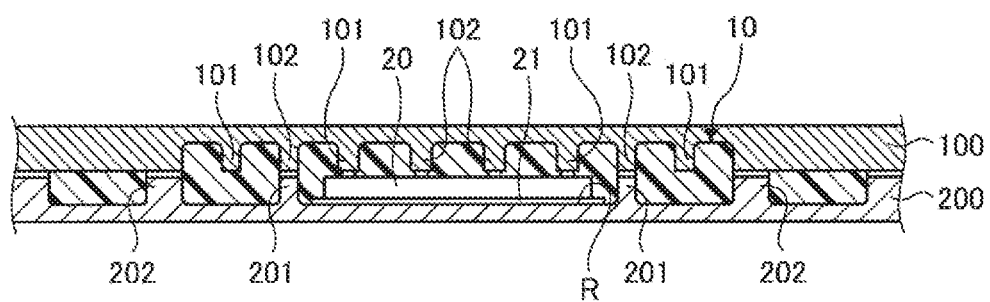
FIG. 8 depicts a specific example of a resin layer forming process.

Then, an insulating resin is filled in the space C between the first frame 100 and the second frame 200, so that the resin layer 10 configured by the insulating resin and the first component 20 is formed (step S15). Specifically, for example, as shown in FIG. 8, the insulating resin is filled in the space C between the first frame 100 and the second frame 200, and at the same time, the insulating resin is extended around the first component 20. Thereby, the first component 20 is embedded in the insulating resin, so that the resin layer 10 is formed. FIG. 8, depicts a specific example of a resin layer forming process.

Figure 9:
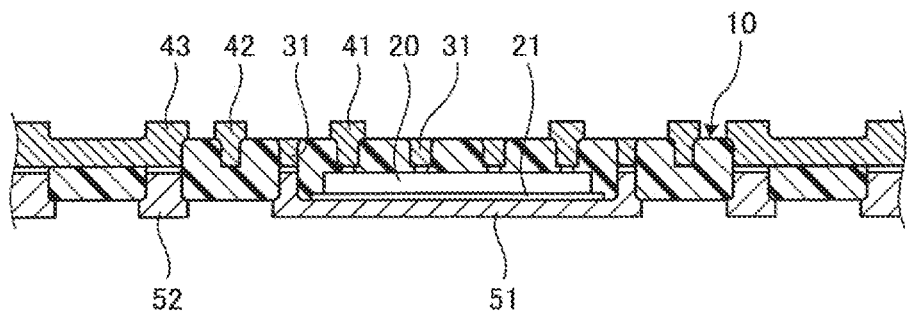
FIG. 9 depicts a specific example of a process of forming wirings and each electrode.

After the resin layer 10 is formed, a predetermined part of the first frame 100 that does not overlap the plurality of first protrusions 101 is etched, so that the wirings 31, the first electrodes 41, the second electrodes 42 and the third electrodes 43 are formed (step S16). Specifically, for example, as shown in FIG. 9, the wirings 31 are formed in positions of the plurality of second protrusions 102, and the first electrodes 41 are formed in positions of the first protrusions 101, which are joined to the first component 20, of the plurality of first protrusions 101. FIG. 9 depicts a specific example of a process of forming wirings and each electrode. In the present embodiment, the wiring portions 41a of the first electrodes 41 are embedded in the resin layer 10 together with the wirings 31, and the electrode portions 41b of the first electrodes 41 protrude from the upper surface-side of the resin layer 10 to positions higher than the upper surfaces of the wirings 31. Thereby, it is possible to secure a predetermined height difference between an end face of the electrode portion 41b becoming a joining surface to the second component 60 and the wiring 31. As a result, a possibility that the second component 60 joined to the first electrode 41 and the wiring 31 will come into contact with each other is reduced, so that the short between the second component 60 and the wiring 31 can be suppressed. Also, for example, as shown in FIG. 9, the second electrodes 42 are formed in positions of the first protrusions 101, which are not joined to the first component 20, of the plurality of first protrusions 101, and the third electrodes 43 are formed in positions of the flat part of the first frame 100. In the present embodiment, the second electrodes 42 and the third electrodes 43 are embedded in the resin layer 10 together with the wirings 31, and protrude from the upper surface-side of the resin layer 10 to the positions higher than the upper surfaces of the wirings 31. Thereby, it is possible to secure a predetermined height difference between the second electrode 42 and third electrode 43 becoming joining surfaces to the third component 70 and the wiring 31. As a result, a possibility that the third component 70 joined to the second electrode 42 and third electrode 43 and the wiring 31 will come into contact with each other is reduced, so that the short between the third component 70 and the wiring 31 can be suppressed.

In parallel with the etching of the first frame 100, a predetermined part of the second frame 200 that does not overlap the first component 20, the edge 201 and the third protrusions 202 is etched, so that the pad 51 and the fourth electrodes 52 are formed. Specifically, for example, as shown in FIG. 9, the pad 51 is formed in positions of the first component 20 and the edge 201, and the fourth electrodes 52 are formed in positions of the third protrusions 202.

Figure 10:
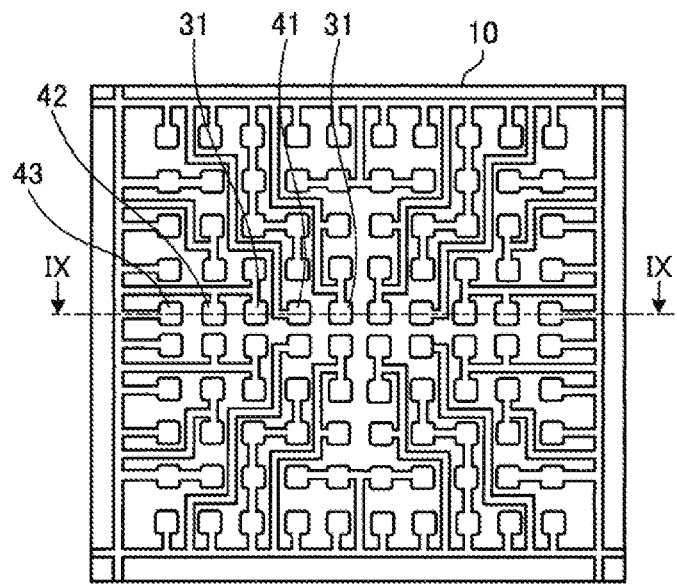
FIG. 10 is a plan view of a resin layer after etching a first frame and a second frame, as seen from above.
Figure 11:
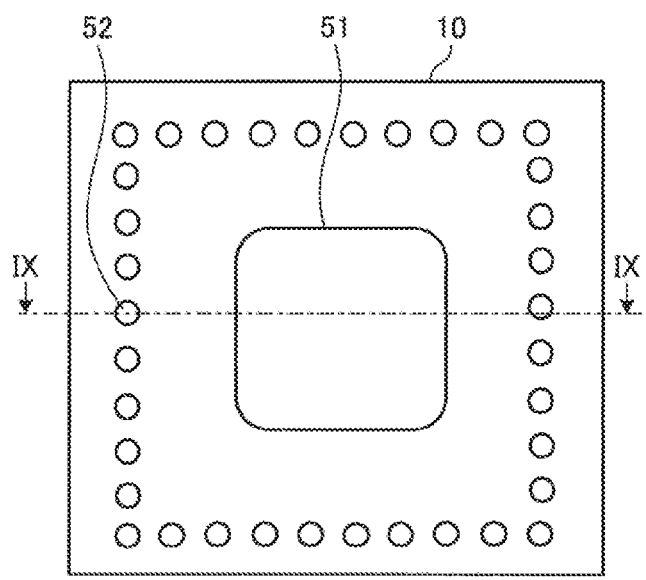
FIG. 11 is a plan view of the resin layer after etching the first frame and the second frame, as seen from below.

Herein, states of the upper surface and lower surface of the resin layer 10 after the first frame 100 and the second frame 200 are etched are described with reference to FIGS. 10 and 11. FIG. 10 is a plan view of the resin layer 10 after etching the first frame 100 and the second frame 200, as seen from above, and FIG. 11 is a plan view of the resin layer 10 after etching the first frame 100 and the second frame 200, as seen from below. A cross-section taken along a line IX-IX of FIGS. 10 and 11 corresponds to the cross-section shown in FIG. 9. As shown in FIG. 10, the upper surfaces of the wirings 31 are exposed on the upper surface-side of the resin layer 10, and the first electrodes 41, the second electrodes 42 and the third electrodes 43 protrude from the upper surface-side of the resin layer 10. As shown in FIG. 11, the pad 51 is arranged on the lower surface of the resin layer 10 and the fourth electrodes 52 protrude from the lower surface-side of the resin layer 10.

Figure 12:
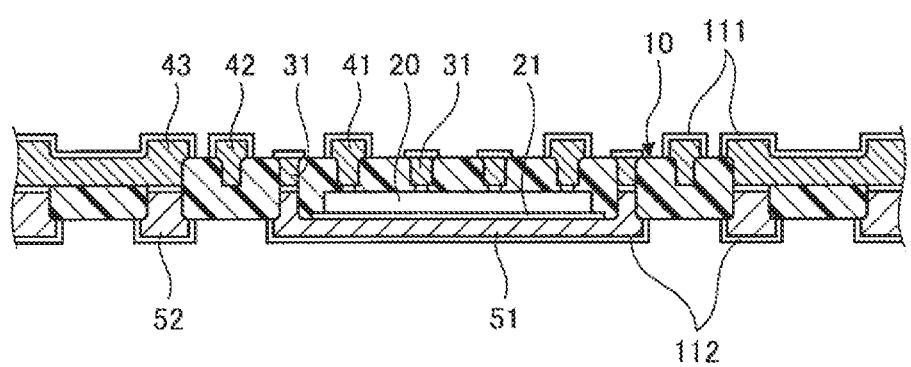
FIG. 12 depicts a specific example of a plating processing process.

Then, the plating is formed in an area, which is exposed from the resin layer 10, of each surface of the wirings 31, the first electrodes 41, the second electrodes 42, the third electrodes 43, the pad 51 and the fourth electrodes 52 (step S17). Specifically, for example, as shown in FIG. 12, a plating 111 is formed in an area, which is exposed from the upper surface-side of the resin layer 10, of each surface of the wirings 31, the first electrodes 41, the second electrodes 42 and the third electrodes 43. At the same time, a plating 112 is formed in an area, which is exposed from the lower surface-side of the resin layer 10, of each surface of the pad 51 and the fourth electrodes 52. FIG. 12 depicts a specific example of a plating processing process. The platings 111 and 112 are formed by a PPF (Pre Plated leadFrame) method, for example. The plating processing process may be omitted, as required.

Figure 13:
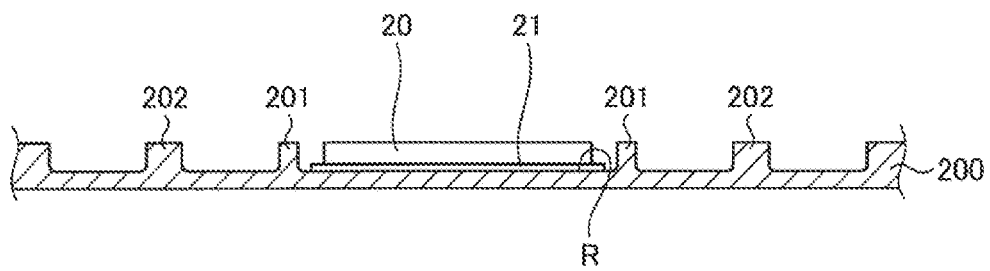
FIG. 13 depicts a specific example of a first component mounting process.

In the example of FIG. 3, after the first frame 100 and the second frame 200 are formed, the first component 20 is joined to some first protrusions and some second protrusions of the first frame 100 (refer to step S13). However, after the first frame 100 and the second frame 200 are formed, the first component 20 may be mounted on the second frame 200. That is, after the first frame forming process (step S11) and the second frame forming process (step S12) are executed, for example, as shown in FIG. 13, the first component 20 may be joined onto the mounting area R, which is surrounded by the edge 201 of the second frame 200, by the joining material 21. FIG. 13 depicts a specific example of a first component mounting process.

After the first component 20 is mounted on the second frame 200, a frame joining process is executed. That is, some first protrusions of the plurality of first protrusions 101 of the first frame 100 and some second protrusions of the plurality of second protrusions 102 are joined to the first component 20, and other some second protrusions 102 of the first frame 100 are joined to the edge 201 of the second frame 200. Thereby, the space C is formed between the first frame 100 and the second frame 200. After the frame joining process is executed, the resin layer forming process (step S15), the process of forming the wirings and each electrode (step S16), and the plating processing process (step S17) are similarly executed.

Figures 14A, 14B:
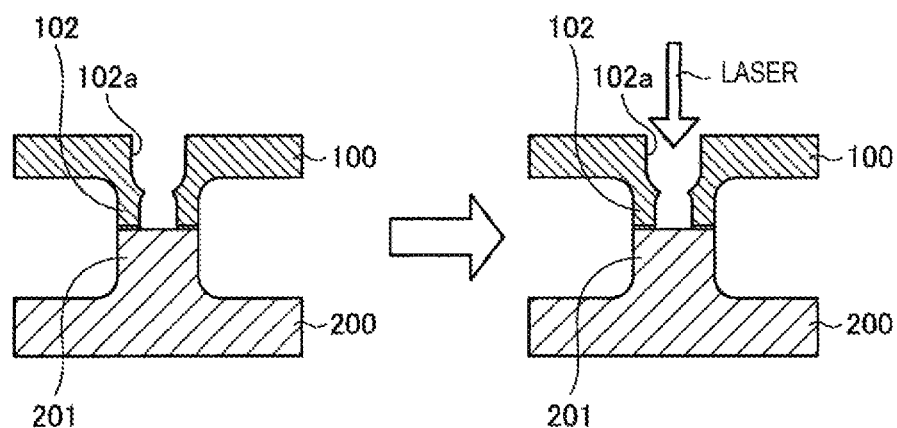
FIGS. 14A and 14B depict an example of a laser welding method.

Also, in the frame joining process (step S14) of FIG. 3, the second protrusions 102 of the first frame 100 and the edge 201 of the second frame 200 are joined to each other by using the soldering. However, the method of joining the second protrusions 102 and the edge 201 is not limited thereto. For example, a laser welding method shown in FIGS. 14A and 14B may be used. FIGS. 14A and 14B depict an example of a laser welding method. In the laser welding method, the second protrusion 102 is formed with a through-hole 102a, and the second protrusion 102 is arranged on the edge 201 (FIG. 14A). Then, laser light is irradiated toward an upper surface of the edge 201 exposed from the through-hole 102a (FIG. 14B). Thereby, the edge 201 irradiated by the laser light is locally melted and is attached on an inner wall of the through-hole 102a of the second protrusion 102, so that the second protrusion 102 and the edge 201 are joined to each other.

Figure 26:
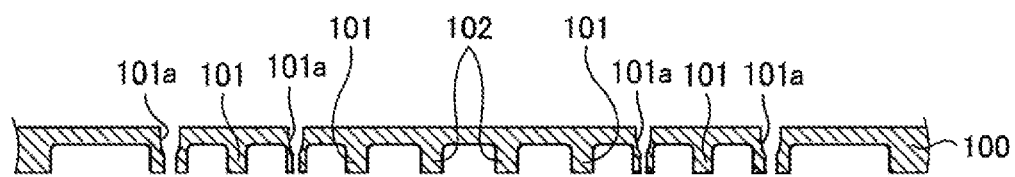
FIG. 26 depicts a modified embodiment of the first frame forming process.
Figure 27:
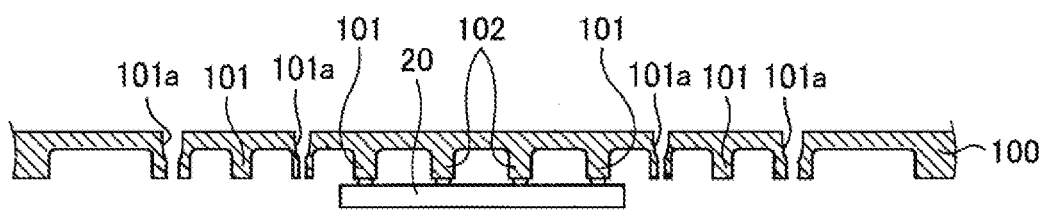
FIG. 27 depicts a modified embodiment of the first component joining process.
Figure 28:
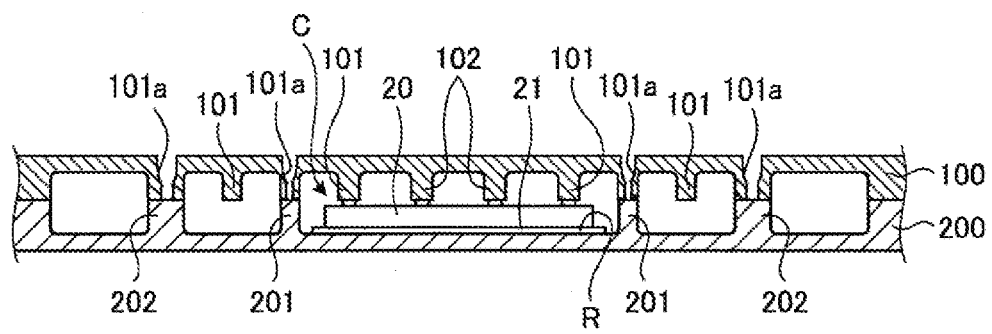
FIG. 28 depicts a modified embodiment of the frame joining process.
Figure 29:
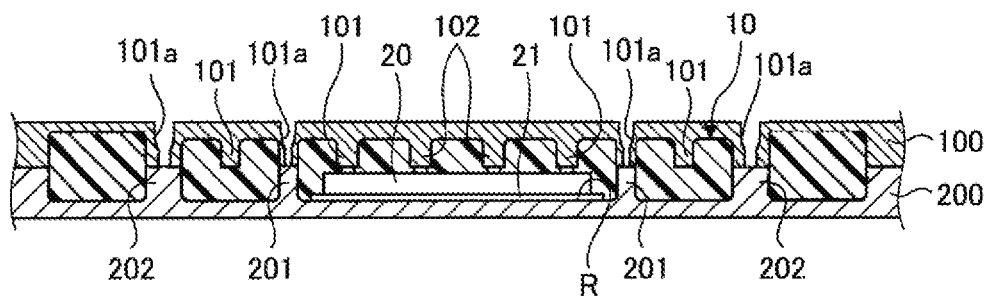
FIG. 29 depicts a modified embodiment of the resin layer forming process.
Figure 30:
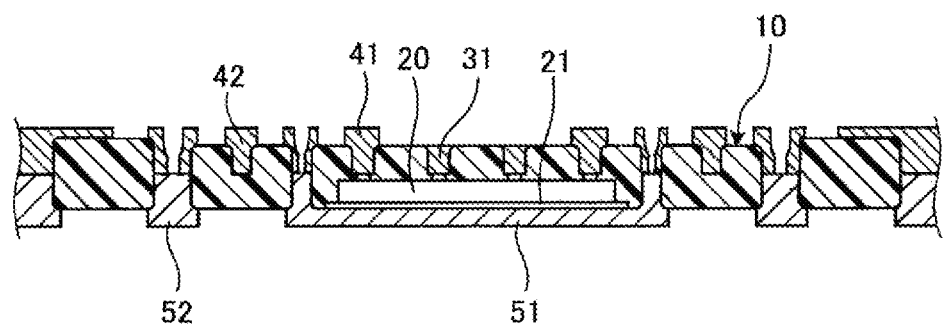
FIG. 30 depicts a modified embodiment of the process of forming wirings and each electrode.
Figure 31:
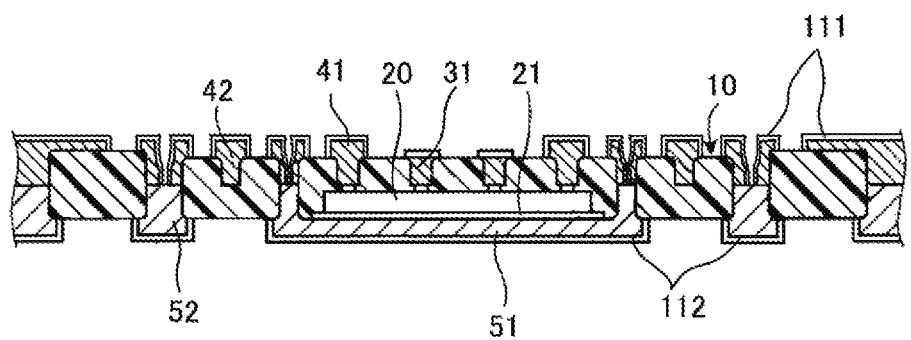
FIG. 31 depicts a modified embodiment of the plating processing process.

FIGS. 26 to 31 depict a manufacturing method of a wiring substrate using a laser welding method in accordance with a modified embodiment. FIG. 26 depicts a modified embodiment of the first frame forming process. FIG. 27 depicts a modified embodiment of the first component joining process. FIG. 28 depicts a modified embodiment of the frame joining process. FIG. 29 depicts a modified embodiment of the resin layer forming process. FIG. 30 depicts a modified embodiment of the process of forming wirings and each electrode. FIG. 31 depicts a modified embodiment of the plating processing process. First, as shown in FIG. 26, a first frame 100 having a plurality of first protrusions 101 and a plurality of second protrusions 102 formed therein is formed. Each of the first protrusions 101 that are to be jointed to the edges 201 and the third protrusions 202 of the second frame 200 is formed with a through-hole 101a. After the first frame 100 is formed, the first component 20 is joined to the two first protrusions 101 and the two second protrusions 102 of the first frame 100 by soldering, for example, as shown in FIG. 27. After the first frame 100 and the second frame 200 are formed, as shown in FIG. 28, the first protrusion 101 of the first frame 100 and the edge 201 of the second frame 200 are joined to each other by using a laser welding method shown in FIG. 14. The first protrusion 101 of the first frame 100 and the third protrusion 202 of the second frame 200 are joined to each other by using a laser welding method shown in FIG. 14. That is, the laser light is irradiated toward an upper surface of the edge 201 exposed from the through-hole 101a and an upper surface of the third protrusion 202 exposed from the through-hole 101a. Thereby, the edge 201 irradiated by the laser light is locally melted and is attached on an inner wall of the through-hole 101a of the first protrusion 101, so that the first protrusion 101 and the edge 201 are joined to each other. The third protrusion 202 irradiated by the laser light is locally melted and is attached on an inner wall of the through-hole 101a of the first protrusion 101, so that the first protrusion 101 and the third protrusion 202 are joined to each other.

After the first frame 100 and the second frame 200 are joined to each other, the insulating resin is filled in the space S between the first frame 100 and the second frame 200, so that the resin layer 10 is formed as shown in FIG. 29. After the resin layer 10 is formed, a predetermined part of the first frame 100 is etched, so that the wirings 31, the first electrodes 41, the second electrodes 42 and other electrodes are formed as shown in FIG. 30. Then, a plating 111 is formed in an area, which is exposed from the upper surface-side of the resin layer 10, of each surface of the wirings 31, the first electrodes 41, the second electrodes 42 and the other electrodes, as shown in FIG. 31. At the same time, a plating 112 is formed in an area, which is exposed from the lower surface-side of the resin layer 10, of each surface of the pad 51 and the fourth electrodes 52.

In place of the laser welding method, for example, a reflow joining method shown in FIG. 15 may be used. FIG. 15 depicts an example of a reflow joining method. In the reflow joining method, the second protrusion 102 is formed with a through-hole 102a and the second protrusion 102 is then arranged on the edge 201 (FIG. 15A). Then, a soldering paste S is filled in the through-hole 102a of the second protrusion 102 (FIG. 15B). Then, heating is performed in the vicinity of the second protrusion 102, so that the soldering paste S is melted (FIG. 15C). Thereby, the melted soldering paste S is attached in a gap between the second protrusion 102 and the edge 201, so that the second protrusion 102 and the edge 201 are joined to each other.

Also, in the plating processing process (step S17) of FIG. 3, the second protrusions 102 of the first frame 100 and the edge 201 of the second frame 200 may be joined to each other by plating. That is, after the second protrusion 102 is formed with the through-hole 102a and the second protrusion 102 is then arranged on the edge 201 (refer to FIG. 14A and FIG. 15A), the plating processing process of FIG. 3 may be executed. Thereby, an inner wall of the through-hole 102a of the second protrusion 102 and the upper surface of the edge 201 exposed from the through-hole 102a are covered with plating, so that the second protrusion 102 and the edge 201 are joined to each other by the plating.

Also, an etching depth of the first frame 100 in the first frame forming process (step S11) of FIG. 3 may be set shallower than an etching depth of the second frame 200 in the second frame forming process (step S12). Thereby, a pitch between the first protrusion 101 becoming the wiring portion 41a of the first electrode 41 and the second protrusion 102 becoming the wiring 31 can be narrowed, so that it is possible to narrow a pitch between the adjacent wirings.

Also, after the first frame forming process (step S11) of FIG. 3 is executed, a part of the first frame 100 except the joining surface with the second frame 200 may be covered with an oxide film. For example, apart of the first frame 100 except an end face of each of the first protrusions 101 and an end face of each of the second protrusions 102 may be covered with an oxide film. The part of the first frame 100 except the joining surface with the second frame 200 is covered with an oxide film, so that the soldering used for joining the first frame 100 and the second frame 200 can be suppressed from wet spreading. As a result, it is possible to suppress a short between the wirings due to wet spreading of the soldering.

[Manufacturing Method of Electronic Device]

Figure 16:
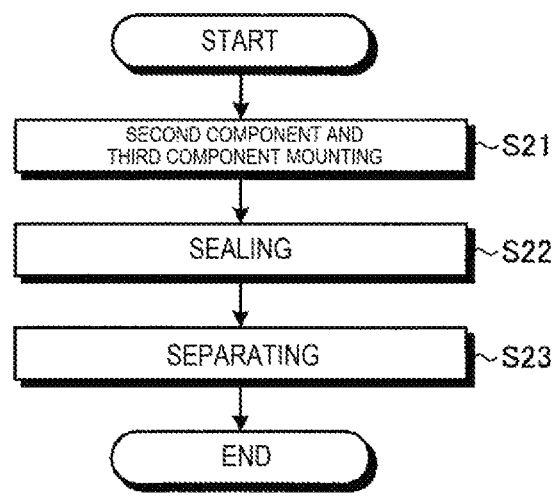
FIG. 16 is a flowchart depicting an example of a manufacturing method of the electronic device in accordance with the embodiment.

Subsequently, a manufacturing method of the electronic device 2 in accordance with the embodiment is specifically described with reference to a flowchart of FIG. 16. FIG. 16 is a flowchart depicting an example of a manufacturing method of the electronic device 2 in accordance with the embodiment.

Figure 17:
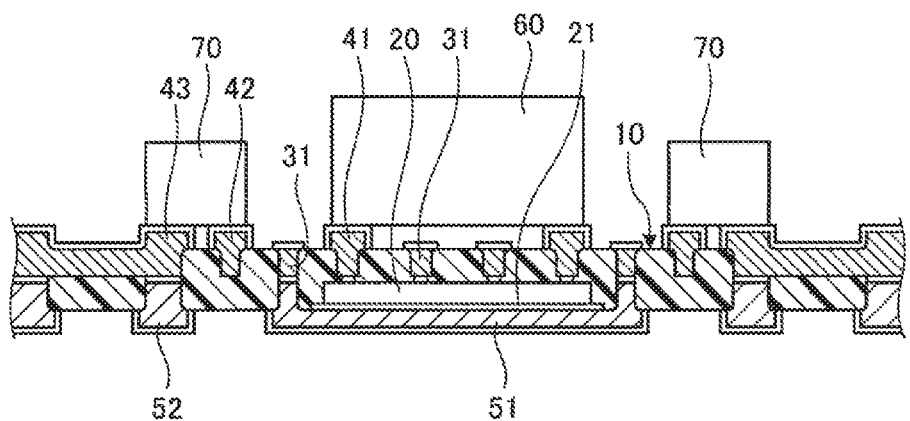
FIG. 17 depicts a specific example of a second component and third component mounting process.

First, the second component 60 and the third components 70 are mounted on the electrodes of the wiring substrate 1 (step S21). Specifically, for example, as shown in FIG. 17, the second component 60 is joined to the first electrodes 41, and the third component 70 is joined to the second electrode 42 and the third electrode 43. FIG. 17 depicts a specific example of a second component and third component mounting process. In the present embodiment, the first electrodes 41 are embedded in the resin layer 10 together with the wirings 31, and protrude from the upper surface-side of the resin layer 10 to positions higher than the upper surfaces of the wirings 31. Thereby, even when the second component 60 is joined to the first electrode 41, the second component 60 and the wiring 31 are spaced by a predetermined interval. Thereby, it is possible to reduce a possibility that the second component 60 joined to the first electrode 41 will come into contact with the wiring 31. As a result, it is possible to suppress the short between the second component 60 joined to the first electrode 41 and the wiring 31. Also, in the present embodiment, the second electrodes 42 and the third electrodes 43 are embedded in the resin layer 10 together with the wirings 31 and protrude from the upper surface-side of the resin layer 10 to positions higher than the upper surfaces of the wirings 31. Thereby, even when the third component 70 is joined to the second electrode 42 and the third electrode 43, the third component 70 and the wiring 31 are spaced by a predetermined interval. Thereby, it is possible to reduce a possibility that the third component 70 joined to the second electrode 42 and third electrode 43 will come into contact with the wiring 31. As a result, it is possible to suppress the short between the third component 70 joined to the second electrode 42 and third electrode 43 and the wiring 31.

Figure 18:
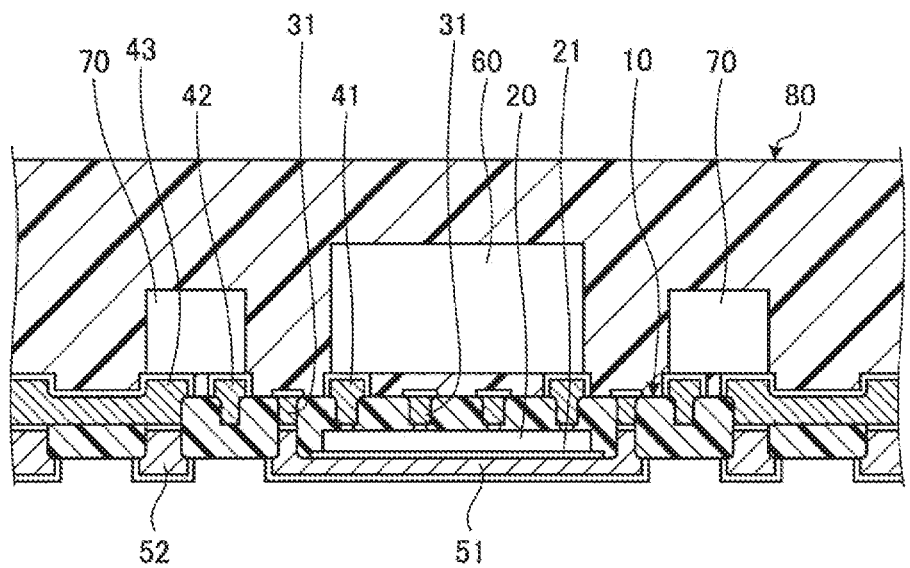
FIG. 18 depicts a specific example of a sealing process.

After the second component 60 and the third components 70 are mounted on the electrodes of the wiring substrate 1, the second component 60 and the third components 70 are sealed by the sealing resin 80 (step S22). Specifically, for example, as shown in FIG. 18, the sealing resin 80 is formed on the resin layer 10 so as to cover the second component 60 and the third components 70. FIG. 18 depicts a specific example of a sealing process. An insulating resin of forming the sealing resin 80 may be a similar resin to the insulating resin forming the resin layer 10.

Figure 19:
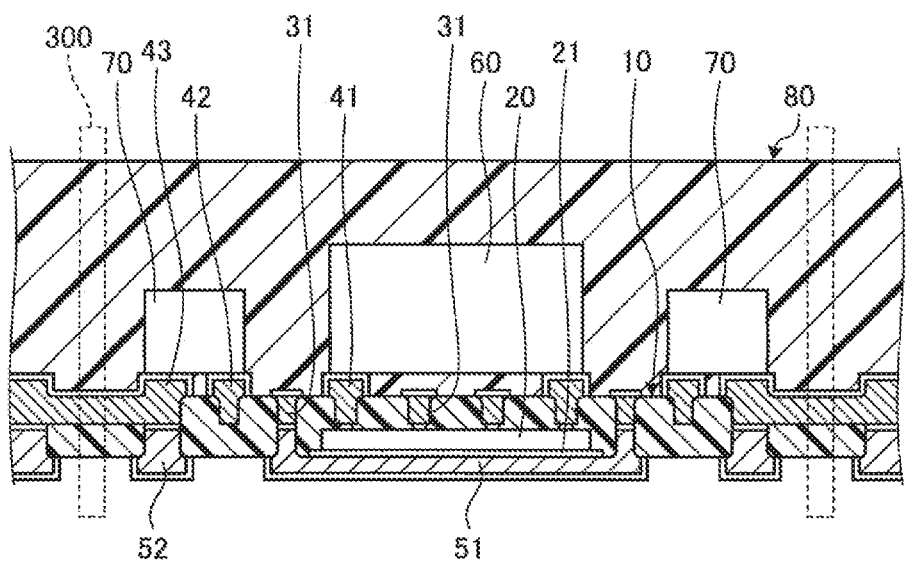
FIG. 19 depicts a specific example of a separating process.

After the second component 60 and the third components 70 are sealed by the sealing resin 80, the wiring substrate 1 is separated into an individual piece (step S23). Specifically, for example, as shown in FIG. 19, the wiring substrate 1 and the sealing resin 80 are cut by a blade 300, so that the wiring substrate 1 is separated into an individual piece. FIG. 19 depicts a specific example of a separating process. The wiring substrate 1 is separated into an individual piece, so that the electronic device 2 shown in FIG. 2 is completed.

Figure 20:
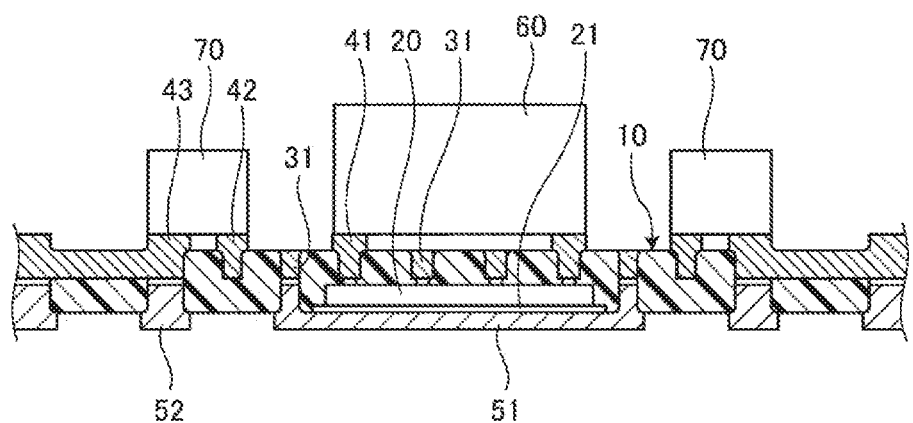
FIG. 20 depicts a modified embodiment of the second component and third component mounting process.

In the example of FIG. 16, the electronic device 2 is manufactured using the plated wiring substrate 1. However, when manufacturing the wiring substrate 1, the plating processing process (step S17 in FIG. 3) may be omitted. In this case, the electronic device 2 may be manufactured using the wiring substrate 1 for which the plating processing has not been implemented. In the below, a modified embodiment of the manufacturing method of the electronic device 2 is described. First, the second component 60 and the third components 70 are mounted on the electrodes of the wiring substrate 1. That is, for example, as shown in FIG. 20, the second component 60 is joined to the first electrodes 41, and the third components 70 are joined to the second electrodes 42 and the third electrodes 43. FIG. 20 depicts a modified embodiment of the second component and third component mounting process. The joining between the first electrode 41 and the second component 60 and the joining between the second electrode 42 and third electrode 43 and the third component 70 are made by soldering using an oxide film removing agent, for example.

Figure 21:
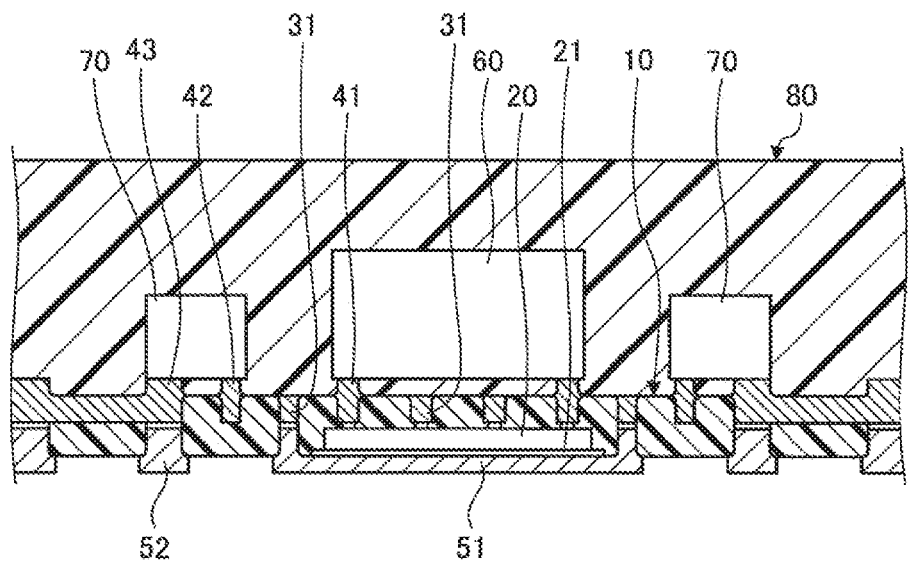
FIG. 21 depicts a modified embodiment of the sealing process.

After the second component 60 and the third components 70 are mounted on the electrodes of the wiring substrate 1, the second component 60 and the third components 70 are sealed by the sealing resin 80. That is, for example, as shown in FIG. 21, the sealing resin 80 is formed on the resin layer 10 so as to cover the second component 60 and the third components 70. FIG. 21 depicts a modified embodiment of the sealing process. In the step in which the sealing resin 80 is formed on the resin layer 10, only parts of the respective surfaces of the pad 51 and the fourth electrodes 52 are exposed from the resin layer 10.

Figure 22:
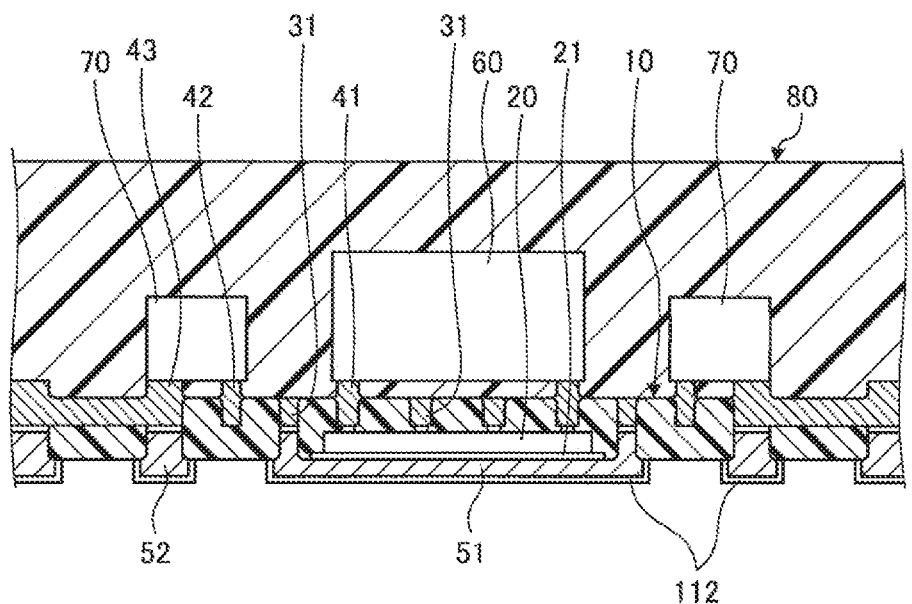
FIG. 22 depicts a modified embodiment of the plating processing process.

Then, a plating is formed in areas exposed from the resin layer 10 of the respective surfaces of the pad 51 and the fourth electrodes 52. That is, for example, as shown in FIG. 22, the plating 112 is formed in areas exposed from the lower surface-side of the resin layer 10 of the respective surfaces of the pad 51 and the fourth electrodes 52. FIG. 22 depicts a modified embodiment of the plating processing process.

Figure 23:
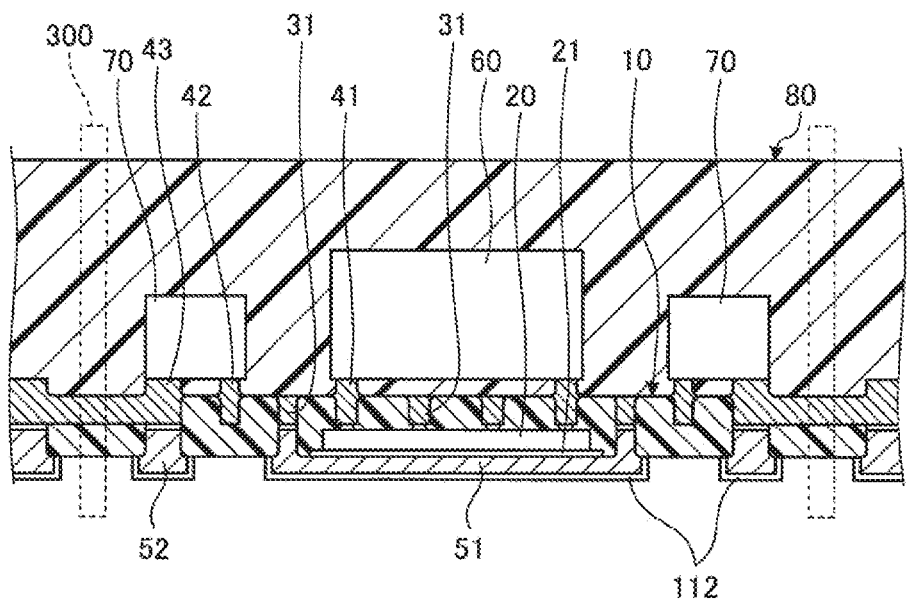
FIG. 23 depicts a modified embodiment of the separating process.

After the plating 112 is formed, the wiring substrate 1 is separated into an individual piece. That is, for example, as shown in FIG. 23, the wiring substrate 1 and the sealing resin 80 are cut by the blade 300, so that the wiring substrate 1 is separated into an individual piece. FIG. 23 depicts a modified embodiment of the separating process.

As described above, the wiring substrate of the embodiment includes a resin layer, a wiring, a first electrode, and a first component. The resin layer is formed of an insulating resin. The wiring is embedded in the resin layer, and an exposed surface thereof is exposed on one surface-side of the resin layer. The first electrode has a wiring portion embedded in the resin layer together with the wiring and connecting to the first component in the resin layer, and an electrode portion protruding from one surface-side of the resin layer to a position higher than the exposed surface of the wiring and capable of being joined to a second component. Thereby, even when the second component is joined to the first electrode, the second component and the wiring are spaced by a predetermined interval. For this reason, it is possible to reduce a possibility that the second component joined to the first electrode will come into contact with the wiring. As a result, it is possible to suppress a short between the second component (external component) joined to the first electrode and the wiring.

Also, in the wiring substrate of the embodiment, the exposed surface of the wiring is exposed on a plane that is flush with one surface of the resin layer. The electrode portion protrudes from the wiring portion to a position higher than one surface of the resin layer. The electrode portion has such a shape that becomes wider toward the wiring portion. Thereby, the outflow of the soldering from the first electrode to the wiring adjacent to the first electrode is limited. As a result, it is possible to suppress a short between the first electrode and the wiring.

Also, the wiring substrate of the embodiment further includes a pad that is arranged on the other surface of the resin layer and the first component in the resin layer is mounted thereon. Thereby, since heat of the first component is radiated via the pad, the radiation performance of the wiring substrate can be improved.

The disclosed embodiment should be construed as being exemplary, not limited, in all respects. The embodiment can be omitted, replaced and changed in diverse forms without departing from the claims and the gist thereof.

Figure 24:
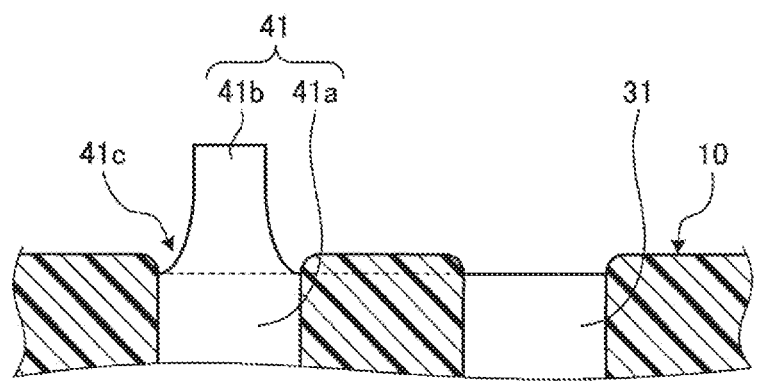
FIG. 24 depicts an example of an exposed position of an upper surface of the wiring.

In the embodiment, the upper surface of the wiring 31 is exposed on the plane that is flush with the upper surface of the resin layer 10. However, the disclosed technology is not limited thereto. For example, the upper surface of the wiring 31 may be exposed in a position lower than the upper surface of the resin layer 10. FIG. 24 depicts an example of an exposed position of the upper surface of the wiring 31. The upper surface of the wiring 31 shown in FIG. 24 is exposed in a position lower than the upper surface of the resin layer 10. The wiring 31 and the first electrode 41 are formed at the same time as predetermined parts of the first frame 100 are etched (refer to FIGS. 8 and 9). The upper surface of the wiring 31 is formed as a predetermined part of the first frame 100 is over-etched to a position lower than the upper surface of the resin layer 10. When the predetermined part of the first frame 100 is over-etched, the wiring portion 41a of the first electrode 41 is embedded in a position inside of the resin layer 10 and lower than the upper surface of the resin layer 10. The electrode portion 41b of the first electrode 41 protrudes from the wiring portion 41a to a position higher than the upper surface of the resin layer 10. The electrode portion 41b has such a shape that becomes wider toward the wiring portion 41a. Apart of aside surface of the electrode portion 41b and the resin layer 10 facing the part of the side surface form a concave portion 41c, a bottom of which is locating at a position lower than the upper surface of the resin layer 10. The concave portion 41c is formed by the part of the side surface of the electrode portion 41b and the resin layer 10 facing the part of the side surface, so that when the electrode portion 41b is joined to the second component by soldering, the soldering is captured by the side surface of the electrode portion 41b and the concave portion 41c. Thereby, the outflow of the soldering from the first electrode 41 to the wiring 31 adjacent to the first electrode 41 is limited. As a result, it is possible to suppress the short between the first electrode 41 and the wiring 31.

Figure 25:
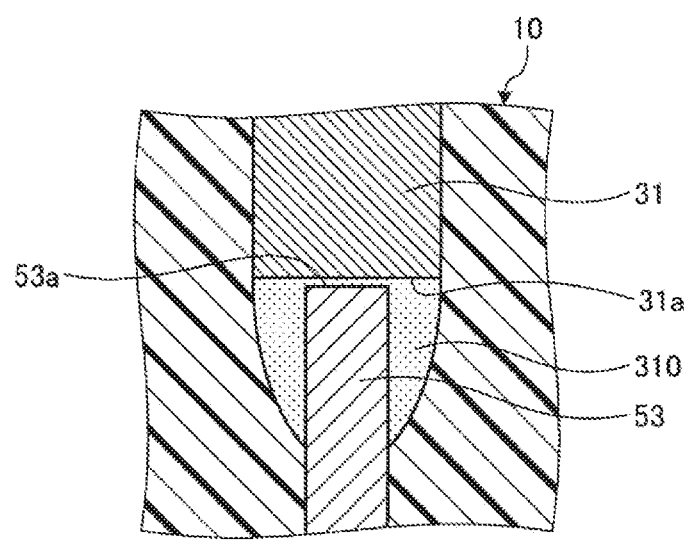
FIG. 25 depicts an example of a connection state of a wiring and another wiring.

In the embodiment, the wiring 31 and the outer edge portion 51b of the pad 51 are connected by the soldering. However, the disclosed technology is not limited thereto. For example, when the outer edge portion 51b is omitted, the wiring 31 and another wiring 53 embedded in the resin layer 10 may be interconnected by soldering, as shown in FIG. 25. FIG. 25 depicts an example of a connection state of the wiring 31 and another wiring 53. Another wiring 53 is embedded in the resin layer 10 and is connected to the wiring 31, and an exposed surface thereof is exposed on the lower surface-side of the resin layer 10. Another wiring 53 and the wiring 31 are interconnected by soldering, for example, in the frame joining process of FIG. 3. A size of a connection surface 53a of the wiring 53 connecting to the wiring 31 is smaller than a size of a connection surface 31a of the wiring 31 connecting to the wiring 53. Thereby, when interconnecting another wiring 53 and the wiring 31 by soldering, in the frame joining process of FIG. 3, a soldering 310 leaked toward an outside of the connection surface 53a of another wiring 53 can be enabled to flow away from the wiring 31 along a side surface of another wiring 53. For this reason, it is possible to suppress the soldering 310 from being leaked to an outside of the connection surface 31a of the wiring 31, so that it is possible to suppress the short between the adjacent wirings.

Also, a melting point of the soldering for interconnecting another wiring 53 and the wiring 31 is preferably lower than a melting point of the soldering for interconnecting the first component 20 and the wiring portion 41a of the first electrode 41. Thereby, when interconnecting another wiring 53 and the wiring 31 by soldering, in the frame joining process of FIG. 3, it is possible to avoid a situation in which the soldering between the first component 20 and the wiring portion 41a of the first electrode 41 is melted. As a result, it is possible to improve the connection reliability of the first component 20 by the soldering.

Figure 32:
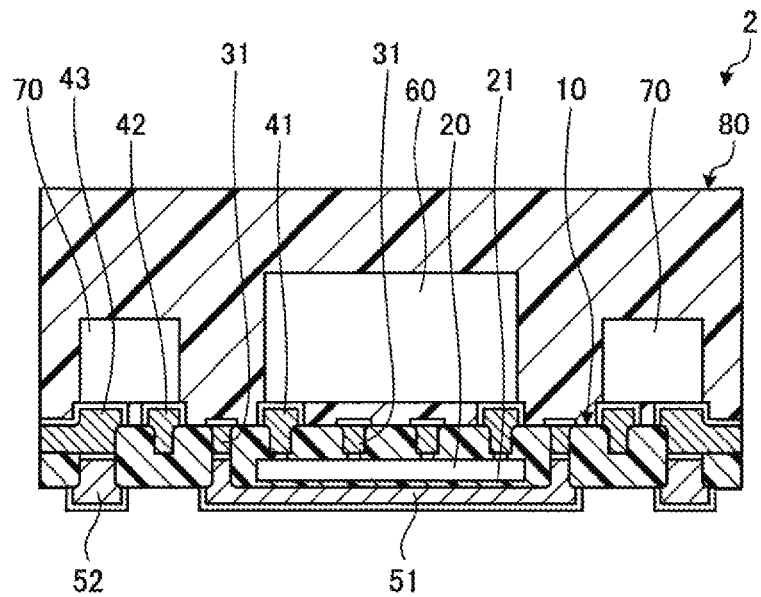
FIG. 32 depicts an example of a configuration of an electrode device in accordance with a modified embodiment.

In the embodiment, the lower surface of the first component 20 is joined to the pad 51 by the joining material 21. However, the disclosed technology is not limited thereto. For example, the lower surface of the first component 20 may be covered by the resin layer 10, as shown in FIG. 32. FIG. 32 depicts an example of a configuration of an electrode device 2 in accordance with a modified embodiment. In the frame joining process (step S14) of FIG. 3, the lower surface of the first component 20 is not joined to the pad 51. In the resin layer forming process (step S15), the lower surface of the first component 20 is covered by the resin layer 10.

Figure 33:
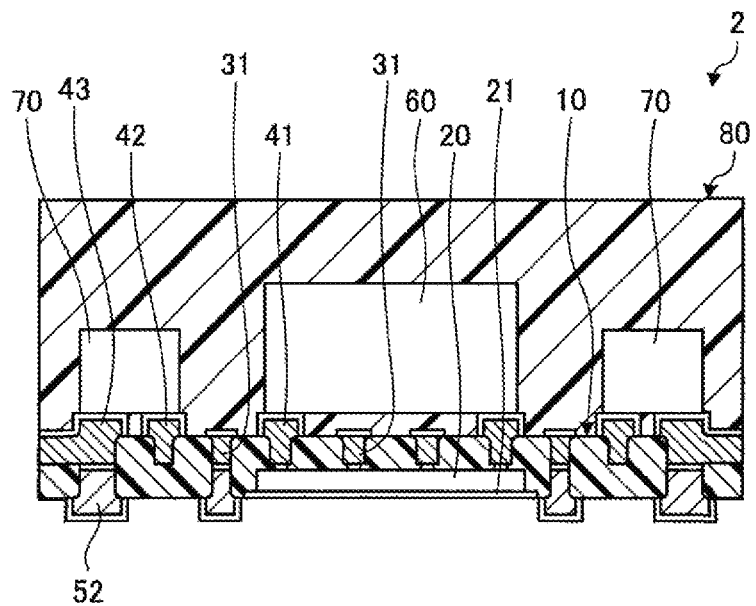
FIG. 33 depicts an example of a configuration of an electrode device in accordance with a modified embodiment.

Also, for example, the lower surface of the first component 20 may be exposed from the resin layer 10, as shown in FIG. 33. FIG. 33 depicts an example of a configuration of an electrode device 2 in accordance with a modified embodiment. In the process of forming the wirings and each electrode (step S16) of FIG. 3, a predetermined part of the second frame 200 that does not overlap the edge 201 and the third protrusions 202 is etched, so that the outer edge portion 51b and the fourth electrodes 52 are formed. The joining material 21 may be removed, so that the lower surface of the first component 20 is exposed from the resin layer 10.

Figure 34:
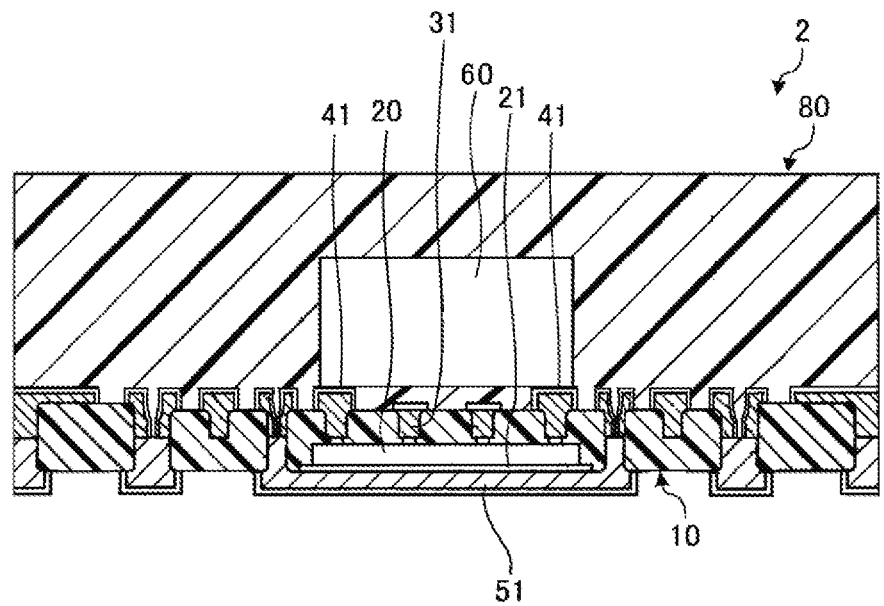
FIG. 34 depicts an example of a configuration of an electrode device manufactured using the wiring substrate shown in FIG. 31.
Figure 35:
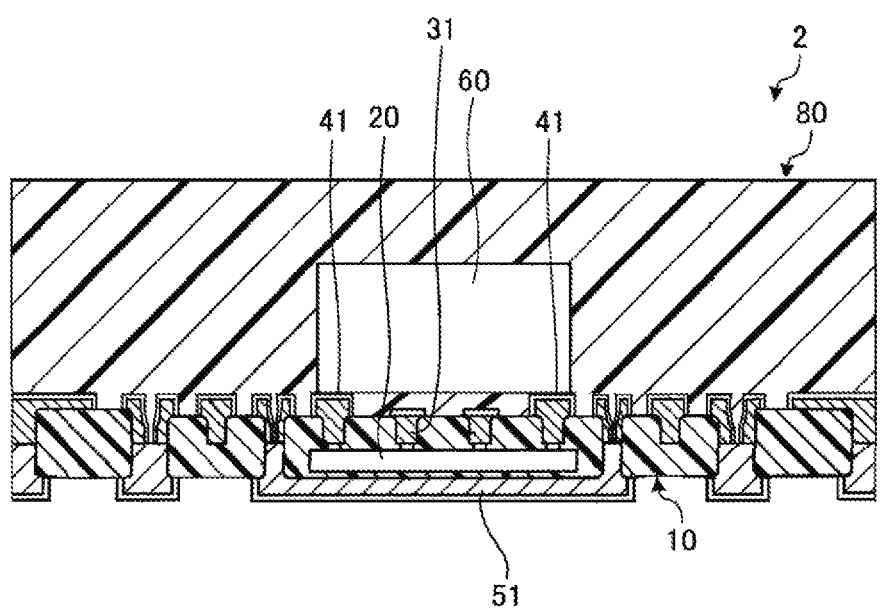
FIG. 35 depicts an example of a configuration of an electrode device in accordance with a modified embodiment.
Figure 36:
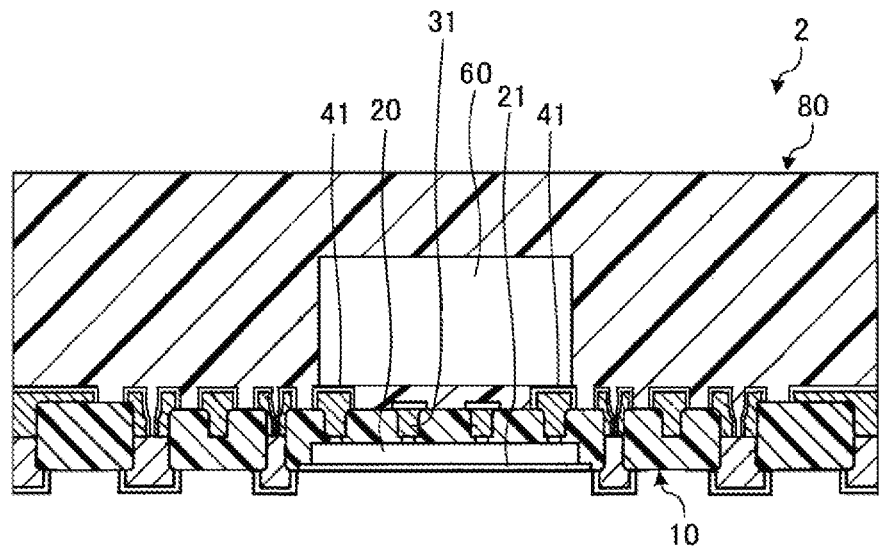
FIG. 36 depicts an example of a configuration of an electrode device in accordance with a modified embodiment.

FIG. 34 depicts an example of a configuration of an electrode device 2 manufactured using the wiring substrate shown in FIG. 31. The lower surface of the first component 20 is joined to the pad 51 by the joining material 21. However, the disclosed technology is not limited thereto. The lower surface of the first component 20 may be covered by the resin layer 10, as shown in FIG. 35. FIG. 35 depicts an example of a configuration of an electrode device 2 in accordance with a modified embodiment. In the frame joining process (step S14) of FIG. 3, the lower surface of the first component 20 is not joined to the pad 51. In the resin layer forming process (step S15), the lower surface of the first component 20 is covered by the resin layer 10. Also, for example, the lower surface of the first component 20 may be exposed from the resin layer 10, as shown in FIG. 36. FIG. 36 depicts an example of a configuration of an electrode device 2 in accordance with a modified embodiment. In the process of forming the wirings and each electrode (step S16) of FIG. 3, a predetermined part of the second frame 200 that does not overlap the edge 201 and the third protrusions 202 is etched, so that the outer edge portion 51b and the fourth electrodes 52 are formed. The joining material 21 may be removed, so that the lower surface of the first component 20 is exposed from the resin layer 10.

This disclosure further encompasses various exemplary embodiments, for example, described below.

[1] A manufacturing method of a wiring substrate, the method comprising:

forming a first frame having a plurality of first protrusions and a plurality of second protrusions;

forming a second frame having a mounting area in which a first component can be mounted;

joining the first component to some of the plurality of first protrusions of the first frame and some of the plurality of second protrusions of the first frame;

mounting the first component onto the mounting area of the second frame and joining the first frame and the second frame each other;

filling an insulating resin in a space between the first frame and the second frame to form a resin layer formed of the insulating resin; and etching predetermined portions of the first frame that do not overlap the plurality of first protrusions to form wirings of which exposed surfaces are exposed on one surface-side of the resin layer in positions of the plurality of second protrusions and to form first electrodes in positions of some first protrusions joined to the first component of the plurality of first protrusions, each of the first electrodes having a wiring portion connecting to the first component in the resin layer and an electrode portion protruding from one surface-side of the resin layer to a position higher than the exposed surface of the wiring and capable of being joined to a second component.

[2] A manufacturing method of a wiring substrate, the method comprising:

forming a first frame having a plurality of first protrusions and a plurality of second protrusions;

forming a second frame having a mounting area in which a first component can be mounted;

mounting the first component on the mounting area of the second frame;

joining some of the plurality of first protrusions of the first frame and some of the plurality of second protrusions of the first frame to the first component and joining the first frame and the second frame each other;

filling an insulating resin in a space between the first frame and the second frame to form a resin layer formed of the insulating resin; and etching predetermined portions of the first frame that do not overlap the plurality of first protrusions to form wirings of which exposed surfaces are exposed on one surface-side of the resin layer in positions of the plurality of second protrusions and to form first electrodes in positions of some first protrusions joined to the first component of the plurality of first protrusions, each of the first electrodes having a wiring portion connecting to the first component in the resin layer and an electrode portion protruding from one surface-side of the resin layer to a position higher than the exposed surface of the wiring and capable of being joined to a second component.

What is claimed is:

1. A wiring substrate comprising:
    a resin layer formed of an insulating resin;
    a first component, at least a part of which is embedded in the resin layer;
    a first wiring embedded in the resin layer, the first wiring including an exposed surface exposed from the resin layer at a first surface-side of the resin layer; and
    a first electrode including a wiring portion and an electrode portion, the wiring portion embedded in the resin layer and connecting to the first component in the resin layer, the electrode portion protruding from the first surface-side of the resin layer to a position higher than the exposed surface of the first wiring,
    wherein the electrode portion is connected to the wiring portion, the electrode portion is not connected to the first wiring, and the electrode portion is exposed to an outside of the wiring substrate, and
    wherein the electrode portion and the wiring portion are formed integrally from a same metal.

2. The wiring substrate according to claim 1, wherein the exposed surface of the first wiring is exposed on a plane that is flush with the first surface of the resin layer, and
    wherein the electrode portion has such a shape that becomes wider toward the wiring portion.

3. The wiring substrate according to claim 1, wherein the exposed surface of the first wiring is exposed in a position lower than the first surface of the resin layer,
    wherein the wiring portion is embedded in a position inside of the resin layer and lower than the first surface of the resin layer,
    wherein the electrode portion protrudes from the wiring portion to a position higher than the first surface of the resin layer,
    wherein the electrode portion has such a shape that becomes wider toward the wiring portion, and
    wherein a part of a side surface of the electrode portion and a part of the resin layer facing the part of the side surface form a concave portion, the concave portion having a bottom that is located at a position lower than the first surface of the resin layer.

4. The wiring substrate according to claim 1, further comprising:
    a pad arranged on a second surface of the resin layer,
    wherein the first component in the resin layer is mounted on the pad.

5. The wiring substrate according to claim 4, wherein the pad has:
    a base portion having an area in which the first component is mounted, and
    an outer edge portion erected from the base portion so as to surround the area in which the first component is mounted, embedded in the resin layer and connecting to the first wiring.

6. The wiring substrate according to claim 1, further comprising:
    a second wiring embedded in the resin layer and connecting to the first wiring,
    wherein the second wiring and the first wiring are interconnected by soldering, and wherein a size of a connection surface of the second wiring connecting to the first wiring is smaller than a size of a connection surface of the first wiring connecting to second wiring.

7. The wiring substrate according to claim 1, further comprising:
a second wiring embedded in the resin layer and connecting to the first wiring,
wherein the second wiring and the first wiring are interconnected by soldering,
wherein the first component and the wiring portion of the first electrode are interconnected by soldering, and
wherein a melting point of the soldering for interconnecting the first wiring and second wiring is lower than a melting point of the soldering for interconnecting the first component and the wiring portion of the first electrode.

8. An electronic device comprising:
a resin layer formed of an insulating resin;
a first component, at least a part of which is embedded in the resin layer;
a wiring embedded in the resin layer, the wiring including an exposed surface exposed from the resin layer at one surface-side of the resin layer;
a first electrode including a wiring portion and an electrode portion, the wiring portion embedded in the resin layer and connecting to the first component in the resin layer, the electrode portion protruding from the one surface-side of the resin layer to a position higher than the exposed surface of the wiring;
a second component joined to the first electrode; and
a sealing resin configured to seal the second component together with the electrode portion,
wherein the electrode portion is connected to the wiring portion, and the electrode portion is not connected to the wiring, and
wherein the electrode portion and the wiring portion are formed integrally from a same metal.

* * * * *